United States Patent [19]

Lomp et al.

[11] Patent Number: 5,661,734
[45] Date of Patent: Aug. 26, 1997

[54] TRELLIS CODED FM DIGITAL COMMUNICATIONS SYSTEM AND METHOD

[75] Inventors: Gary R. Lomp, New York; Donald L. Schilling, Sands Point, both of N.Y.

[73] Assignee: InterDigital Technology Corporation, Wilmington, Del.

[21] Appl. No.: 542,347

[22] Filed: Oct. 12, 1995

Related U.S. Application Data

[63] Continuation of Ser. No. 261,062, Jun. 13, 1994, Pat. No. 5,461,632, which is a continuation of Ser. No. 732,200, Jul. 19, 1991, Pat. No. 5,351,249.

[51] Int. Cl.⁶ .................................................. G06F 11/10
[52] U.S. Cl. ............... 371/43.1; 371/37.01; 375/269; 375/334; 329/300; 332/100; 340/825.58
[58] Field of Search .......................... 371/37.1, 43, 44, 371/45; 375/271, 269, 272, 302, 303; 329/300; 332/100; 340/825.58

[56] References Cited

U.S. PATENT DOCUMENTS

| | | | |
|---|---|---|---|
| 4,581,601 | 4/1986 | Calderbank et al. | 340/347 |
| 4,788,694 | 11/1988 | Calderbank | 375/59 |
| 4,831,635 | 5/1989 | Lee et al. | 375/19 |
| 4,901,331 | 2/1990 | Calderbank et al. | 375/39 |
| 4,939,555 | 7/1990 | Calderbank et al. | 375/17 |
| 4,945,549 | 7/1990 | Simon et al. | 375/53 |
| 5,023,889 | 6/1991 | Divsalar et al. | 375/27 |
| 5,103,463 | 4/1992 | Schoeneberg | 375/51 |
| 5,321,725 | 6/1994 | Paik et al. | 375/39 |
| 5,373,532 | 12/1994 | Fujita et al. | 375/67 |
| 5,373,533 | 12/1994 | Hayashihara et al. | 375/88 |
| 5,379,324 | 1/1995 | Mueller et al. | 375/94 |

OTHER PUBLICATIONS

A. R. Calderbank. "New Trellis Codes Based on Lattices and Cosets" IEEE Transactions on Information Theory II –33 No. 2 pp. 177–195, Mar. 1987.

Atkins et al., "An Efficient Modulation/Coding Scheme for MFSK Systems on Bandwidth Constrained Channels", pp. 1396–1397, 1399–1401, IEEE.

Schilling et al., "Mary Trellis Coded ESK for Narrowband Low Rate Applications" pp. 558–562.

*Primary Examiner*—Robert W. Beausoliel, Jr.
*Assistant Examiner*—Albert Décady
*Attorney, Agent, or Firm*—David Newman & Associates, P.C.

[57] ABSTRACT

A method and apparatus for encoding and convolutionally decoding a data word of a data word sequence. Each data word has k bits. An encoder selects, using a trellis encoding algorithm and a previous data word, a $2^k$ subset of signal points from a square set of M by M signal points having X coordinates and Y coordinates. The square set of M by M signal points includes a constellation of $2^{k+1}$ signal points. The encoder selects, using the $n^{th}$ data word, a signal point from the selected subset of signal points. A modulator generates a first channel symbol and a second channel symbol from the selected signal point. A demodulator demodulates the first channel symbol as a received X coordinate and the second channel symbol as a received Y coordinate. A decoder estimates, using a second processor, a $2^k$ received subset of signal points using the convolutionally decoding algorithm and a previously received data word. The decoder estimates, an $n^{th}$ received data word from the received X coordinate, the received Y coordinate, and the estimated-received subset of signal points.

12 Claims, 4 Drawing Sheets

TRELLIS CODED FM DIGITAL COMMUNICATIONS SYSTEM AND METHOD

RELATED PATENTS

This patent is a continuation of patent application entitled TRELLIS CODED FM DIGITAL COMMUNICATIONS SYSTEM AND METHOD, having Ser. No. 08/261,062 and filing date of Jun. 13, 1994, now U.S. Pat. No. 5,461,632 which is a continuation of Ser. No. 07/732,200 and filing date Jul. 19, 1991, now U.S. Pat. No. 5,351,249. The benefit of the earlier filing date of the parent patent applications is claimed pursuant to 35 U.S.C. §120.

BACKGROUND OF THE INVENTION

This invention relates to a trellis encoded, narrowband FM system (NBFM) with spectral efficiency and low bit error rate.

DESCRIPTION OF THE RELEVANT ART

Trellis encoding has evolved primarily into phase and amplitude modulation signalling schemes but not into frequency modulation signalling schemes. A trellis code is a technique for encoding a data stream into a sequence of real vectors that are transmitted over a noisy communications channel. Using phase modulation, two dimensional signal spaces are easily obtainable for generating vectors since in-phase and quadrature-phase signals can be generated with sine and cosine signals. Similarly, quadrature amplitude modulation (QAM) takes advantage of in-phase and quadrature-phase signals, and varying amplitudes of a signal.

The mapping of two dimensional signal space is well developed in the prior art for PSK and QAM signalling schemes. A trellis code using PSK and QAM schemes increases power efficiency and reduces errors. The mapping of two dimensional signal spaces is not well developed, however, for FM systems.

OBJECTS OF THE INVENTION

A general object of the invention is to increase power efficiency of M-ary digital FM communications using coding.

Another object of the invention is to relax the requirements on hardware capable of modulating and demodulating M-ary channel symbols while still permitting bandwidth efficiency, i.e., a high number of bits per symbols, communications. This objective is achieved by appealing to the fact that embedding messages in high dimensional signal spaces offers greater immunity to noise and other system errors.

SUMMARY OF THE INVENTION

According to the present invention, as embodied and broadly described herein, a trellis encoded, narrow band frequency modulation (NBFM) digital communications system is provided comprising first processor means, modulator means, transmitter means, a communications channel, demodulator means, and second processor means. The system is used for encoding and decoding an $n^{th}$ data word, symbol, of a data word sequence. Each encoded data word is assumed to have k bits per symbol. The system encodes the data word sequence, sends the encoded data word sequence over the communications channel, and then decodes the data word sequence.

More particularly, the first processor means is preprogrammed with a square set of M by M signal points which have M indices of X coordinates and M indices of Y coordinates. Alternatively, the first processor means may be preprogrammed with a rectangular set of signal points. A square set of signal points is optimal. Additionally, the invention can be extended to $\Gamma$ dimensions making a $\Gamma$ dimensional cube.

The square set of M by M signal points is sufficiently large to include a constellation of $2^{k+1}$ signal points. The increase from $2^k$ to $2^{k+1}$ represents the effect of coding. The first processor means selects, using a trellis encoding algorithm and a previous data word or a plurality of previous data words, a $2^k$ subset of signal points from the square set of M by M signal points. The previous, $(n-1)^{th}$, data word is the data word that was processed previously in time to the $n^{th}$ data word presently being encoded. The processor means selects, using the $n^{th}$ data word, a signal point from the selected subset of signal points. The selected signal point has an X coordinate and a Y coordinate.

The modulator means can generate up to M channel symbols from an M-ary signalling scheme which correspond to the M indices of X coordinates and the M indices of Y coordinates. The M-ary signalling scheme might have, for example, for six channel symbols, a six frequency-shift-keying (FSK) signalling scheme. Using the X coordinate and Y coordinate of the selected signal point, the modulator means generates a first channel symbol of the M-ary signalling scheme from the X coordinate and a second channel symbol of the M-ary signalling scheme from the Y coordinate. The transmitter means transmits the first channel symbol and the second channel symbol over a communications channel. The first channel symbol and the second channel symbol preferably are transmitted in sequence, although simultaneous multitone transmission is possible.

The demodulator means demodulates the first channel symbol as a received X coordinate and the second channel symbol as a received Y coordinate, thereby producing a two dimensional demodulator output. The two dimensional demodulator outputs are inputs to the decoding algorithm, which is the Viterbi algorithm, and which uses a previously received data word, or a plurality of previously received data words, for producing a maximum likelihood sequence of estimates of the information symbols. The second processor estimates an $n^{th}$ received data word from the received X coordinate, the received Y coordinate, and the estimated-previously received subset of signal points.

The present invention also may be a method for encoding and decoding an $n^{th}$ data word of a data word sequence. The method comprises the steps of selecting, using a predetermined coding algorithm and a previous data word, a $2^k$ subset of signal points from a square set of M by M signal points having M indices of X coordinates and M indices of Y coordinates. The square set of M by M signal points includes a constellation of $2^{k+1}$ signal points. The method also selects, using the $n^{th}$ data word, a signal point from the selected subset of signal points. A first channel symbol of an M-ary signalling scheme is generated from an X coordinate of the selected signal point, and a second channel symbol of an M-ary signalling scheme is generated from a Y coordinate of the selected signal point. The first channel symbol and the second channel symbol are transmitted over a communications channel.

The method includes demodulating the first channel symbol as a received X coordinate and the second channel symbol as a received Y coordinate, and estimates a $2^k$ received subset of signal points using the predetermined algorithm and a previously received data word. An $n^{th}$ received data word is estimated from the received X coordinate, the received Y coordinate, and the estimated-received subset of signal points.

Additional objects and advantages of the invention will be set forth in part in the description which follows, and in part will be obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

FIG. 2A illustrates a code index scheme for a subset of signal points;

FIG. 2B illustrates a square set of signal points for M=6;

FIG. 3A is a example of a first selected signal point within a first subset of signal points;

FIG. 3B is an example of a second selected signal point within a second subset of signal points; and FIG. 3C is an example of a third selected signal point within a third subset of signal points.

DETAILED DESCRIPTION OF THE PREFERRED EMBODIMENTS

Figure 1:
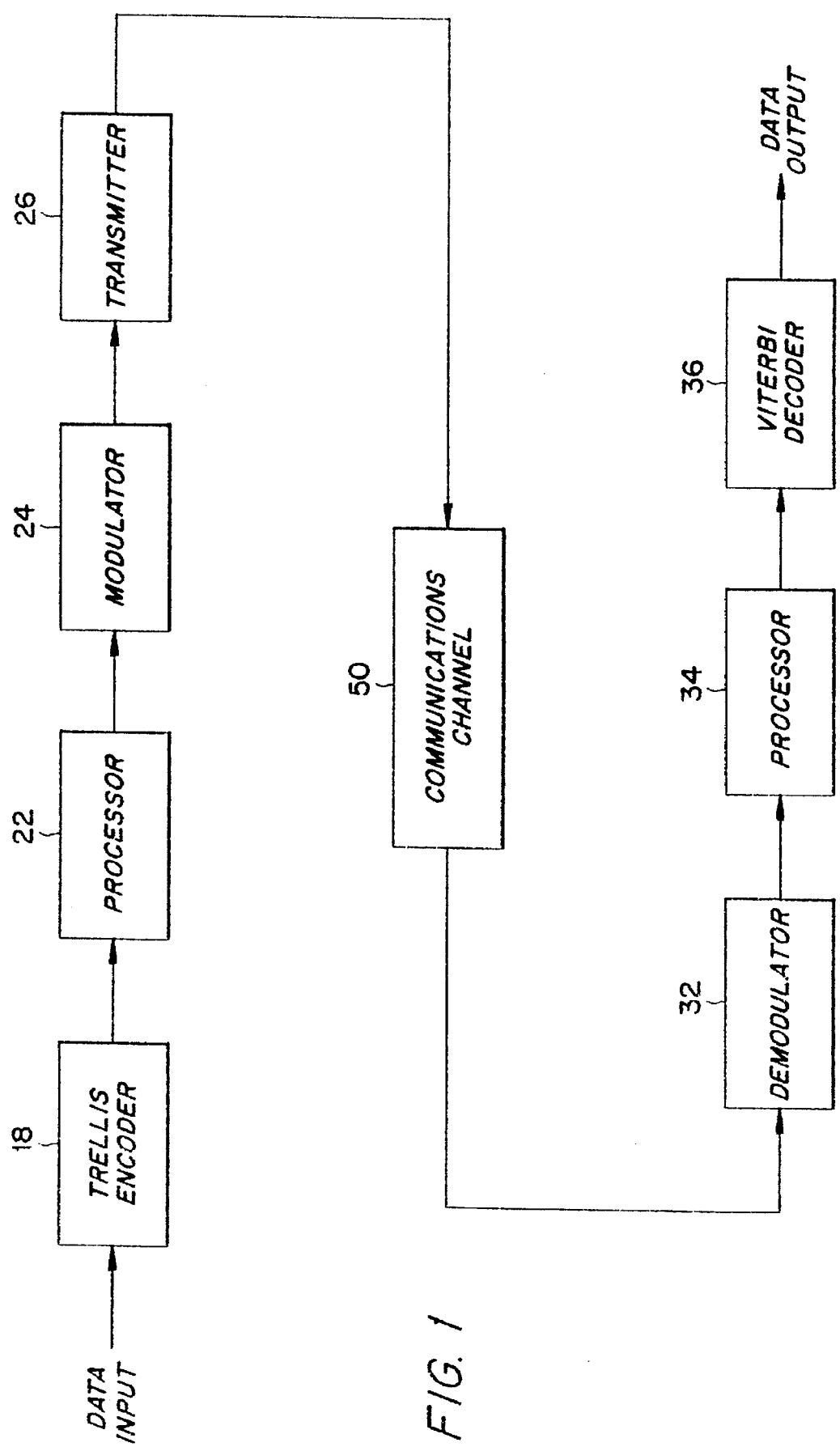
FIG. 1 is a block diagram of the trellis encoded, digital FM communications system.

Reference will now be made in detail to the present preferred embodiments of the invention, examples of which are illustrated in the accompanying drawings, wherein like reference numerals indicate like elements throughout the several views.

In the exemplary arrangement shown in FIG. 1, a trellis encoded, digital communications system is provided comprising a first processor means, modulator means, transmitter means, a communications channel 50, demodulator means, and second processor means. The first processor means is embodied as an first processor 22, the modulator means is embodied as modulator 24 and the transmitter means is embodied as a transmitter 26. The first processor 22 is coupled to a data source. The modulator 24 is coupled between the first processor 22 and the transmitter 26, and the transmitter 26 is coupled to the communications channel 50.

The demodulator means broadly may be embodied as a demodulator 32. For narrowband frequency modulation (NBFM) using FSK, the modulator 24 may include an FM or FSK modulator, such as a voltage controlled oscillator or Armstrong type of modulator circuit, and the demodulator 32 may include an FM or FSK demodulator, such as an FM discriminator, a phase-locked-loop (PLL) circuit or other FM demodulator circuit. The second processor means may be embodied as a second processor 34. The second processor 34 is coupled between the demodulator 32 and a data output. The first processor 22 may be separate from a trellis encoder 18, or the first processor 22 may include the trellis encoder 18. Similarly, the second processor 34 may be separate from a trellis decoder 36, or the second processor 34 may include the trellis decoder 36.

The digital communications system is used for encoding and decoding a data word of a data word sequence. The invention is taught, by way of example, with encoding and decoding an $n^{th}$ data word. Each data word is assumed to have k bits. The system encodes the data word sequence, sends the encoded data word sequence over the communications channel 50 using NBFM FSK modulation, and then decodes the data word sequence.

More particularly, the first processor 22 is preprogrammed with a square set of M by M signal points which have M indices for X coordinates and H indices Y coordinates. Alternatively, the first processor means may be preprogrammed with a rectangular set of signal points. A square set of signal points is optimal. Additionally, the invention can be extended to $\Gamma$ dimensions making a $\Gamma$ dimensional cube.

The square set of M by M signal points includes a constellation of $2^{k+1}$ signal points. For data words having four (k=4) data bits, by way of example, the square set would include six by six signal points, which is a square of 36 signal points. The 36 signal points includes the constellation of $2^{4+1}$, which equals 32, signal points.

The first processor 22, using a trellis encoding algorithm and a previous data word or a plurality of previous data words, selects a $2^k$ subset of signal points from the square set of M by M signal points. For the example, the subset of signal points includes four by four, which equals a square of sixteen, signal points. In practice, rectangular, circular or any other constellation of subset of signal points can be used with the present invention. Trellis encoding algorithms, which are well known in the art for PSK and QAM signalling schemes, can be used with the FM encoding scheme disclosed herein.

The previous data word and each of the plurality of previous data words is a data word that was processed previously in time to the $n^{th}$ data word presently being encoded. Thus, the $(n-1)^{th}$ data word would be used by the predetermined algorithm for selecting which four by four signal points, in the example, are the subset of signal points from the six by six signal points. The preferred encoding scheme would be based on the coset codes of Calderbank and Sloane, which are based on lattice type constellations. This scheme is well known in the art and described in "New Trellis Codes Based on Lattices and Cosets," A. R. Calderbank and N. J. A. Sloane, IEEE TRANSACTIONS ON INFORMATION THEORY, Vol. IT-33, No. 2, March 1987.

Trellis coding schemes are also discussed in: U.S. Pat. No. 4,939,555 having issue date of Jul. 3, 1990, and entitled, TRELLIS CODING ARRANGEMENT to Calderbank and Sloane; U.S. Pat. No. 4,901,331 having issue date of Feb. 13, 1990, and entitled TRELLIS CODES WITH PASS BAND SPECTRAL NULLS to Calderbank and Mazo; U.S. Pat. No. 4,831,635 having issue date of May 16, 1989, and entitled TRELLIS CODES WITH SPECTRAL NULLS to Lee and Calderbank; U.S. Pat. No. 4,788,694 having issue date of Nov. 29, 1988, and entitled TRELLIS CODING WITH SUBSTATES (sic) to Calderbank; and U.S. Pat. No. 4,581,601 having issue date of Apr. 8, 1986, and entitled MULTI-DIMENSIONAL CODING FOR ERROR REDUCTION to Calderbank and Sloane; which are all incorporated herein by reference.

As an example, the previous signal point, which corresponds to the previous data word, can be used for locating the subset of signal points in the square set of signal points. An algorithm could require that a corner of the subset of signal points always be the previous signal point.

Similarly, the concept can be extended to using a plurality of previous data words for locating the subset of signal points in the square of signal points. An algorithm could require that a corner of the subset of signal points always be at a location determined from a function of the location of three previous signal points, for example.

The first processor 22 selects, using the $n^{th}$ data word, a signal point from the selected subset of signal points. In the example, the data bits of the four bit data word are split into two half-data words of two bits each by partitioning the four data bits in half. The first half-data word selects a column from the four by four subset of data points, and the second half-data word selects a row from the four by four subset of data points. The intersection of the selected row and column is at the selected data point. The columns and rows of the subset of signal points can be indexed with the binary numbers of all the possible half-data words. While the ordering of the columns and rows must be consistent, they may be ordered according to binary numbering, Gray codes, or any other scheme.

Figures 2A, 2B:
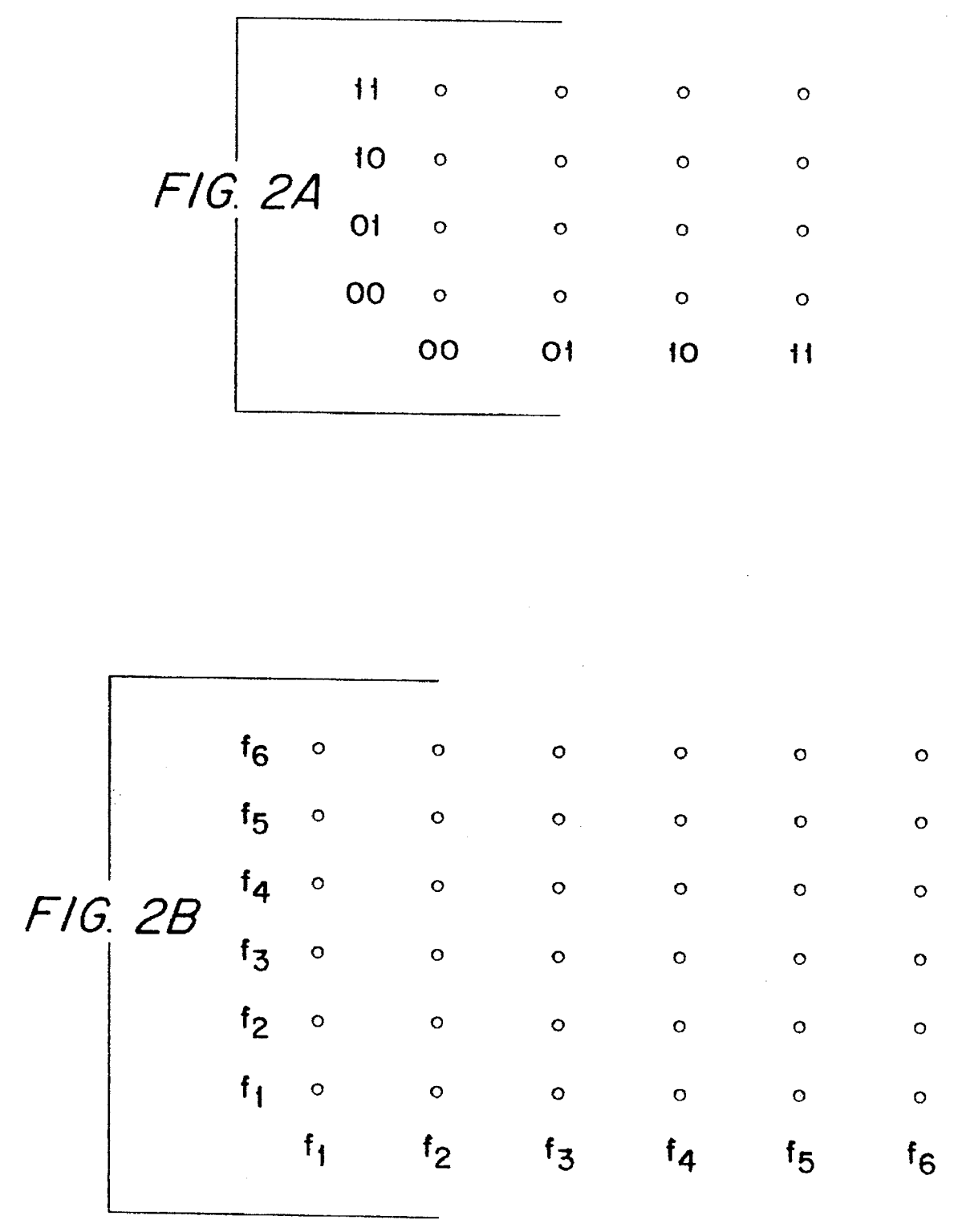

FIG. 2A illustrates an ordering of column and rows for a square subset of signal points. Although a square subset of signal points is shown, other shapes such as rectangular, circular, or more generally any two dimensional lattice work with the present invention.

The M by M signal points define M indices of X coordinates and M indices of Y coordinates. The selected signal point has an X coordinate and a Y coordinate, defined in the M by M signal points. The modulator can generate up to M channel symbols from an M-ary signalling scheme which correspond to the M indices of X coordinates and the M indices of Y coordinates.

FIG. 2B illustrates a square set of signal points for M=6, with the coordinates, i.e. rows and columns labelled with the six FSK frequencies. Thus, each of the X coordinates and the Y coordinates takes on one of the frequencies. The M-ary signalling scheme might have, for example, for six channel symbols (M=6), a six frequency-shift-keying (FSK) signalling scheme. The FSK signals might modulate a carrier signal at a carrier frequency. Thus, for six FSK, the frequencies might be $f_1=+5$ kHz, $f_2=+3$ kHz, $f_3=+1$ kHz, $f_4=-1$ kHz, $f_5=-3$ kHz, and $f_6=-5$ kHz, with respect to the carrier frequency.

Using the X coordinate and Y coordinate of the selected signal point, the modulator 24 generates a first channel symbol of the M-ary signalling scheme from the X coordinate and a second channel symbol of the M-ary signalling scheme from the Y coordinate. The combination of the first and second channel symbols is a code symbol. The modulator 24 can modulate the first channel symbol and the second channel symbol sequentially or simultaneously in time.

The transmitter 26 transmits the first channel symbol and the second channel symbol over the communications channel 50. The first channel symbol and the second channel symbol can be sent sequentially in time or simultaneously in time. The first channel symbol is orthogonal to the second channel symbol. For the example, if the first channel symbol and the second channel symbol are transmitted simultaneously, then the frequencies, in the FSK signalling example, would be orthogonal to each other. If the first channel symbol and the second channel symbol are transmitted sequentially, then they are orthogonal because they are transmitted at different points in time. Thus, if the first channel symbol and the second channel symbol were +3 kHz and -5 kHz of an FSK signalling scheme, then the transmitter would send a code symbol of +3 kHz and -5 kHz, either sequentially in time or simultaneously in time, on the carrier frequency.

The demodulator 32 demodulates the first channel symbol as a received X coordinate and the second channel symbol as a received Y coordinate. The received X coordinate and the received Y coordinate are voltages which are noisy estimates of the X-Y coordinate points.

The second processor 34 estimates a $2^k$ received subset of signal points using a decoding algorithm and a previously received data word, or a plurality of previously received data words. Using a plurality of previously received data words enables the second processor 34 to employ information which spans the time period of many channel symbols in order to make a decision on the $n^{th}$ channel symbol.

The second processor 34 estimates an $n^{th}$ received data word from the received X coordinate, the received Y coordinate, and the estimated-received subset of signal points. The decoding algorithm can be based on known techniques such as used for codes developed for phase-shift-keying (PSK) or quadrature amplitude modulation (QAM) schemes. The decoding algorithm in a preferred embodiment would be the Viterbi algorithm, which is well known in the art.

The present invention alternatively may be a method for encoding and decoding an $n^{th}$ data word of a data word sequence. The method comprises the steps of selecting, using a trellis encoding algorithm and a previous data word, a $2^k$ subset of signal points from a square set of N by N signal points having X coordinates and Y coordinates. The square set of M by M signal points includes a constellation of $2^{k+1}$ signal points. The method also selects, using the $n^{th}$ data word, a signal point from the selected subset of signal points. A first channel symbol of an M-ary signalling scheme is generated from an X coordinate of the selected signal point, and a second channel symbol of an M-ary signalling scheme is generated from a Y coordinate of the selected signal point. The first channel symbol and the second channel symbol are transmitted over a communications channel.

The method also includes demodulating the first channel symbol as a received X coordinate and the second channel symbol as a received Y coordinate, and estimating a $2^k$ received subset of signal points using the decoding algorithm and a previously received data word. An $n^{th}$ received data word is estimated from the received X coordinate, the received Y coordinate, and the estimated-received subset of signal points.

Figure 3C:
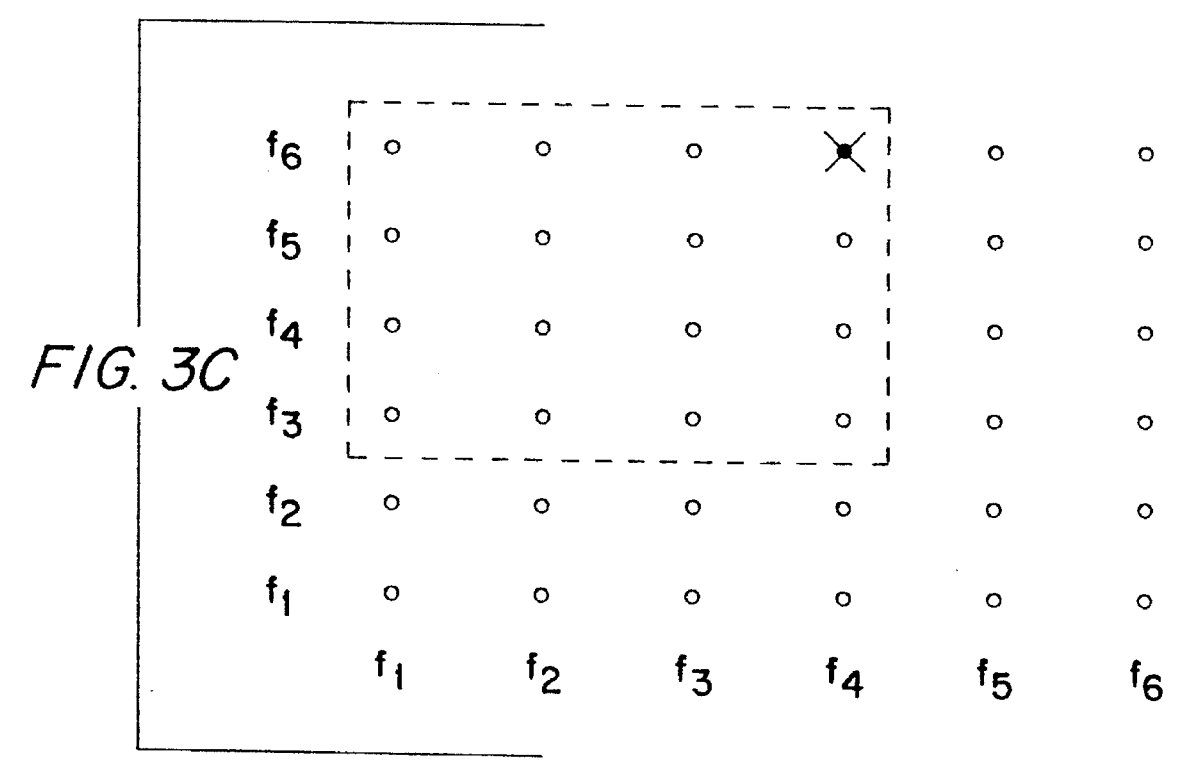

Operation of the invention can be understood by way of example, shown in FIGS. 3A-3C, using the ordering of columns and rows of a square subset of signal points and the coordinate labelled with the FSK frequencies of the square set of signal points of FIGS. 2A and 2B, respectively. Assume a data bit sequence enters the first processor 22. Assume that the first processor performs trellis encoding and outputs the following data bits:

010101011111

Assume that the trellis encoding operates on data words of four bits per data word, and the trellis encoder locates the subset of signal points, as indicated in the dashed area, sequentially as shown in FIGS. 3A-3C. For the first data word i.e. the first four data bits, 0 1 0 1, a first selected signal point is located in a first subset of signal points which intersect with the row and column of the square set of signal points at frequencies $f_4$ and $f_3$. Thus, frequencies $f_4$ and $f_3$ are sent over the communications channel.

For the second data word, i.e. the second four data bits, 0101, a second selected signal point is located in a second subset of signal points which intersect with the row and column of the square set of the signal points at frequencies $f_2$ and $f_2$. Thus, the frequencies $f_2$ and $f_2$ are sent over the communications channel.

For the third data word, i.e. the third set of four data bits, 1 1 1 1, a third selected signal point is located in a third subset of signal points which intersect with the row and column of the square set of signal points at frequencies $f_4$ and $f_6$. Thus, the frequencies $f_6$ and $f_4$ are sent over the communications channel.

At the receiver, the pairs of received frequencies, $f_4f_3$, $f_2f_2$ and $f_4f_6$, form a vector of received data points. The Viterbi algorithm can be used for trellis decoding this vector of data points, as is done for PSK, QAM, etc.

It will be apparent to those skilled in the art that various modifications can be made to the trellis coded FM communications system and method of the instant invention without departing from the scope or spirit of the invention, and it is intended that the present invention cover modifications and variations of communications using trellis coded FM provided they come in the scope of the appended claims and their equivalents.

We claim:

1. A method for encoding and convolutionally decoding a plurality of data words in a data word sequence, each of said plurality of data words having k bits, with k being a number of bits in each of said plurality of data words, and with each of said plurality of data words defining a signal point, comprising the steps of:

selecting, for a first data word in the data word sequence, using a trellis encoding algorithm and a previous signal point, a first $2^k$ subset of signal points from a two-dimensional lattice of signal points having a plurality of X coordinates and a plurality of Y coordinates, the two-dimensional lattice of signal points including a constellation of $2^{k+1}$ signal points, a corner of the first $2^k$ subset of signal points being defined by the previous signal point;

selecting, using the first data word, a first signal point from the first $2^k$ subset of signal points, the first signal point having an X coordinate and a Y coordinate;

generating a first frequency-shift-keying (FSK) signal from an M-ary FSK signalling scheme of the X coordinate of said first signal point;

generating a second FSK signal from the M-ary FSK signalling scheme of the Y coordinate of said first signal point;

transmitting the first FSK signal at a first frequency and the second FSK signal at a second frequency over a communications channel, the first frequency being orthogonal to the second frequency;

demodulating the first FSK signal as a first received X coordinate and the second FSK signal as a first received Y coordinate;

estimating a first $2^k$ received subset of signal points using a convolutionally decoding algorithm and a previously received data word;

estimating a first received data word from the first received X coordinate, the first received Y coordinate, and the first $2^k$ received subset of signal points;

selecting, for an nth data word in the data word sequence, using said trellis encoding algorithm and a previous signal point, an nth $2^k$ subset of signal points from the two-dimensional lattice of signal points;

selecting, using the nth data word, an nth signal point from the nth $2^k$ subset of signal points, the nth signal point having an X coordinate and a Y coordinate;

generating a third FSK signal from the M-ary FSK signalling scheme of the X coordinate of said nth signal point;

generating a fourth FSK signal from the M-ary FSK signalling scheme of the Y coordinate of said nth signal point;

transmitting the third FSK signal at a third frequency and the fourth FSK signal at a fourth frequency over a communications channel, the third frequency being orthogonal to the fourth frequency;

demodulating the third FSK signal as a second received X coordinate and the fourth FSK signal as a second received Y coordinate;

estimating an nth $2^k$ received subset of signal points using the convolutionally decoding algorithm and a previously received data word; and estimating an nth received data word from the second received X coordinate, the second received Y coordinate, and the nth $2^k$ received subset of signal points.

2. The method as set forth in claim 1, with the corner of the first $2^k$ subset of signal points defined by a function of the previous signal point and a location of two signal points previous to the previous signal point.

3. The method as set forth in claim 1, the first FSK signal and the second FSK signal being transmitted sequentially.

4. The method as set forth in claim 1, the first FSK signal and the second FSK signal being transmitted simultaneously.

5. The method as set forth in claim 1, the step of selecting the first signal point comprising the steps of:

splitting the first data word into two half-data words, each half data-word having ½ k bits;

selecting, responsive to a first half-data word, a column from the two-dimensional lattice of signal points;

selecting, responsive to a second half-data word, a row from the two-dimensional lattice of signal points;

wherein an intersection of the selected column and the selected row defines the first signal point.

6. The method as set forth in claim 1, the step of selecting a first $2^k$ subset of signal points from a two-dimensional lattice of signal points including the step of selecting a first $2^k$ subset of signal points from a rectangular set of signal points.

7. The method as set forth in claim 1, the step of selecting a first $2^k$ subset of signal points from a two-dimensional lattice of signal points including the step of selecting a first $2^k$ subset of signal points from a circular set of signal points.

8. The method as set forth in claim 1, the step of selecting a first $2^k$ subset of signal points from a two-dimensional lattice of signal points including the step of selecting a first $2^k$ subset of signal points from a square set of M by M signal points, with M being a number of indices of the plurality of X coordinates and the plurality of Y coordinates.

9. The method as set forth in claim 1, wherein at least one of:

the step of selecting a first $2^k$ subset of signal points includes selecting the first $2^k$ subset of signal points using the trellis encoding algorithm with a plurality of previous signal points; and the step of estimating a first $2^k$ received subset of signal points includes using the convolutionally decoding algorithm and a plurality of previously received data words;

the step of selecting an nth $2^k$ subset of signal points includes selecting the $n^{th}$ $2^k$ subset of signal points using the trellis encoding algorithm with a plurality of previous signal points; and the step of estimating an nth $2^k$ received subset of signal points includes using the convolutionally decoding algorithm and a plurality of previously received data words.

10. A method for encoding and convolutionally decoding a plurality of data words in a data word sequence, each of said plurality of data words having k bits, with k being a number of bits in each of said plurality of data words, comprising the steps of:

selecting, for a first data word in the data word sequence, using a trellis encoding algorithm and a previous signal point, a first $2^k$ subset of signal points from a two-dimensional lattice of signal points having a plurality of X coordinates and a plurality of Y coordinates, the two-dimensional lattice of signal points including a constellation of $2^{k+1}$ signal points, a corner of the selected first $2^k$ subset of signal points being defined by the previous signal point;

selecting, using the first data word, a first signal point from the first $2^k$ subset of signal points, the first signal point having an X coordinate and a Y coordinate;

generating a first frequency-shift-keying (FSK) signal from an M-ary FSK signalling scheme of the X coordinate of said first signal point;

generating a second FSK signal from the M-ary FSK signalling scheme of the Y coordinate of said first signal point;

transmitting the first FSK signal at a first frequency and the second FSK signal at a second frequency over a communications channel, the first frequency being orthogonal to the second frequency;

receiving the first frequency and the second frequency as a first frequency pair;

demodulating the first FSK signal as a first received X coordinate and the second FSK signal as a first received Y coordinate;

estimating a first $2^k$ received subset of signal points using a decoding algorithm and a previously received data word;

estimating a first received data word from the first received X coordinate, the first received Y coordinate, and the first $2^k$ received subset of signal points;

selecting, for a second data word in the data word sequence, using said trellis encoding algorithm and a previous signal point, a second $2^k$ subset of signal points from the two-dimensional lattice of signal points;

selecting, using the second data word, a second signal point from the second $2^k$ subset of signal points, the second signal point having an X coordinate and a Y coordinate;

generating a third FSK signal from the M-ary FSK signalling scheme of the X coordinate of said second signal point;

generating a fourth FSK signal from the M-ary FSK signalling scheme of the Y coordinate of said second signal point;

transmitting the third FSK signal at a third frequency and the fourth FSK signal at a fourth frequency over a communications channel, the third frequency being orthogonal to the fourth frequency;

receiving the third frequency and the fourth frequency as a second frequency pair;

demodulating the third FSK signal as a second received X coordinate and the fourth FSK signal as a second received Y coordinate;

estimating a second $2^k$ received subset of signal points using the decoding algorithm and a previously received data word;

estimating a second received data word from the second received X coordinate, the second received Y coordinate, and the second $2^k$ received subset of signal points;

selecting, for an nth data word in the data word sequence, using said trellis encoding algorithm and a previous signal point, an nth $2^k$ subset of signal points from the two-dimensional lattice of signal points;

selecting, using the nth data word, an nth signal point from the nth $2^k$ subset of signal points, the nth signal point having an X coordinate and a Y coordinate;

generating a fifth FSK signal from the M-ary FSK signalling scheme of the X coordinate of said nth signal point;

generating a sixth FSK signal from the M-ary FSK signalling scheme of the Y coordinate of said nth signal point;

transmitting the fifth FSK signal at a fifth frequency and the sixth FSK signal at a sixth frequency over a communications channel, the fifth frequency being orthogonal to the sixth frequency;

receiving the fifth frequency and the sixth frequency as a third frequency pair;

demodulating the fifth FSK signal as a third received X coordinate and the sixth FSK signal as a third received Y coordinate;

estimating an nth $2^k$ received subset of signal points using the decoding algorithm and a previously received data word; and estimating an nth received data word from the third received X coordinate, the third received Y coordinate, and the nth $2^k$ received subset of signal points.

11. The method as set forth in claim 10, wherein at least one of:

the step of selecting a first $2^k$ subset of signal points includes selecting the first $2^k$ subset of signal points using the trellis encoding algorithm with a plurality of previous signal points; and the step of estimating a first $2^k$ received subset of signal points includes using the decoding algorithm and a plurality of previously received data words;

the step of selecting a second $2^k$ subset of signal points includes selecting the second $2^k$ subset of signal points using the trellis encoding algorithm with a plurality of previous signal points; and the step of estimating a second $2^k$ received subset of signal points includes using the decoding algorithm and a plurality of previously received data words;

the step of selecting an nth $2^k$ subset of signal points includes selecting the nth $2^k$ subset of signal points using the trellis encoding algorithm with a plurality of previous signal points; and the step of estimating an nth $2^k$ received subset of signal points includes using the decoding algorithm and a plurality of previously received data words.

12. The method as set forth in claim 10 wherein the decoding algorithm is a Viterbi algorithm for trellis decoding a vector of received data points formed by the first frequency pair, the second frequency pair, and the third frequency pair.

* * * * *